(12) United States Patent
Kim (10) Patent No.: US 7,968,844 B2
(45) Date of Patent: Jun. 28, 2011

(54) HOLE INSPECTION APPARATUS AND HOLE INSPECTION METHOD USING THE SAME

(75) Inventor: Ho Seob Kim, Incheon (KR)

(73) Assignee: CEBT Co. Ltd., Asan-si (KR)

( * ) Notice: Subject to any disclaimer, the term of this patent is extended or adjusted under 35 U.S.C. 154(b) by 200 days.

(21) Appl. No.: 12/295,770

(22) PCT Filed: Apr. 3, 2007

(86) PCT No.: PCT/KR2007/001634
§ 371 (c)(1),
(2), (4) Date: Oct. 2, 2008

(87) PCT Pub. No.: WO2007/114642
PCT Pub. Date: Oct. 11, 2007

(65) Prior Publication Data
US 2009/0152461 A1  Jun. 18, 2009

(30) Foreign Application Priority Data
Apr. 3, 2006 (KR) .................. 10-2006-0030129

(51) Int. Cl.
*H01J 49/00* (2006.01)

(52) U.S. Cl. ........................ 250/310; 324/751
(58) Field of Classification Search .......... 250/310; 324/751, 750, 752, 158.1
See application file for complete search history.

(56) References Cited

U.S. PATENT DOCUMENTS

| | | | |
|---|---|---|---|
| 6,614,244 B2 * | 9/2003 | Yamada et al. | 324/751 |
| 6,787,770 B2 * | 9/2004 | Kikuchi et al. | 850/10 |
| 7,038,224 B2 * | 5/2006 | Kadyshevitch et al. | 250/492.22 |

* cited by examiner

*Primary Examiner* — Kiet T Nguyen
(74) *Attorney, Agent, or Firm* — John K. Park; Park Law Firm

(57) ABSTRACT

Disclosed herein is an apparatus and method for inspecting the via holes of a semiconductor device using electron beams. The apparatus includes electron beam irradiation means, a current measuring means, and a current measuring means and data processing means. The electron beam irradiation means radiate respective electron beams to inspect a plurality of inspection target holes. The current measuring means measures current, which is generated by irradiating the electron beams, radiated from the electron beam irradiation means, through a conductive layer located under the holes, or through the conductive layer and a separate detector. The data processing means processes data acquired through the measurement of the current measuring means.

17 Claims, 5 Drawing Sheets

HOLE INSPECTION APPARATUS AND HOLE INSPECTION METHOD USING THE SAME

TECHNICAL FIELD

The present invention relates, in general, to an apparatus and method for inspecting the via holes of a semiconductor device using electron beams and, more particularly, to an apparatus and method for inspecting the via holes of a semiconductor device in a relatively short time, which cause a plurality of electron beams, radiated from a plurality of electron beam generation means, to pass through the semiconductor device, thus measuring current.

BACKGROUND ART

Generally, a semiconductor device, such as memory, includes contact holes or via holes to electrically connect active elements, which are formed in the lower portion thereof, to wiring layers, which are formed in the upper portion thereof. The contact holes are formed by etching an insulating layer, such as an oxide layer, from the surface thereof to a lower substrate using Reactive Ion Etching (RIE). In order to optimize etching conditions, it is required that the internal and external structure of each contact hole and the state of the underside of each contact hole be detected.

A tester for inspecting via holes or contact holes is disclosed in Korean Pat. No. 10-0388690. However, this technology was proposed to solve a problem in which, when inspection for via holes is conducted using existing Scanning Electron Microscope (SEM) equipment, the openings of the respective via holes can be detected but information about the bottom sides of the respective via holes cannot be known.

Figure 1:
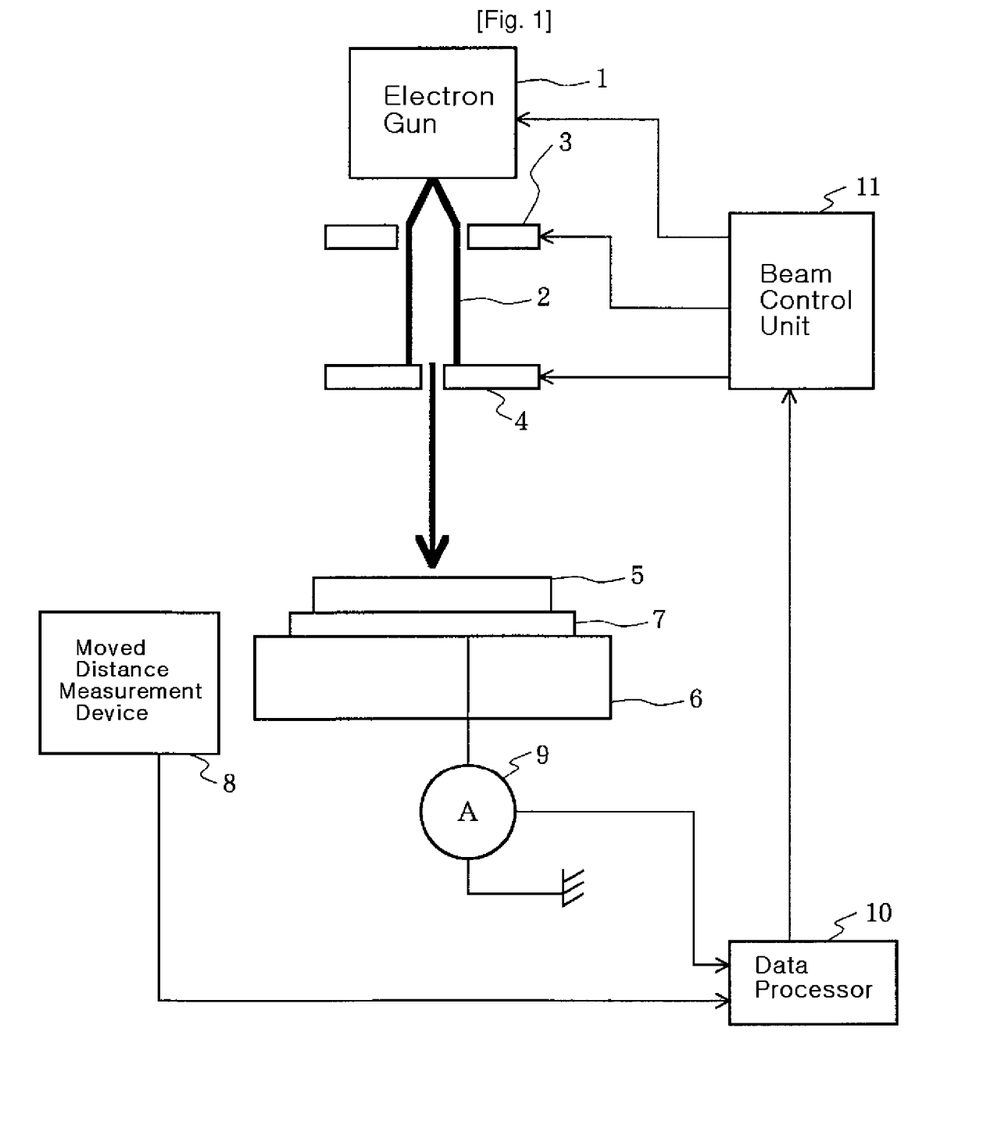
FIG. 1 is a diagram showing a conventional tester for inspecting the holes of a semiconductor device.

FIG. 1 shows an embodiment of Korean Pat. No. 10-0388690. In the patent specification, FIG. 1 is a diagram showing a tester for inspecting the holes of a semiconductor device. The semiconductor device tester includes an electron gun 1 for generating an electron beam 2, a condenser lens 3, an aperture plate 4 for collimating the electron beam 2, a moveable stage 6 used to radiate the electron beam 2 on the desired portions of a sample 5 by moving the sample 5, an electrode 7, a current system 9 for measuring current, which is generated by the sample 5 due to the radiation of the electron beam 2, a moved distance measurement device 8 for measuring the distance that the movable stage 6 moves, a data processor 10, such as a computer, for processing data acquired from the current system 9, and a beam control unit 11 for performing control, such as varying the acceleration voltage of the electron beam and/or varying the radiation period. The electron beam 2 radiated from the electron gun 1 is converted to a collimated beam by the condenser lens 3 and is directed toward the aperture plate 4, which has a very small aperture. The aperture plate 4 is made of a material, such as metal, and is grounded such that the radiated electrons do not accumulate in the aperture plate 4. The electron beam, having passed through the small aperture of the aperture plate 4, is a very thin beam having a cross sectional area substantially identical to the area of the aperture, and is directed toward the sample 5. This aperture plate 4 may be cooled to prevent the diameter of the aperture from being changed by thermal expansion of the aperture plate 4.

However, the conventional hole inspection apparatus, described above, is problematic in that a lot of time is taken because an electron gun 2 that generates a single electron beam is used. That is, in the case where a large number of holes must be inspected, although the respective holes are precisely inspected, a lot of time is taken, because the holes must be individually inspected. Accordingly, a lot of time is required for the manufacturing inspection of a semiconductor device, the inspection of throughholes or the like, and thus a more rapid and convenient inspection apparatus and method are required.

DISCLOSURE OF INVENTION

Technical Problem

Accordingly, the present invention has been made keeping in mind the above problems occurring in the prior art, and an object of the present invention is to provide an apparatus and method that can be used to inspect a plurality of via holes using a plurality of microcolumn as a very small-sized electron columns in a relatively short time.

Technical Solution

In order to accomplish the above object, the present invention provides a hole inspection apparatus, including electron beam irradiation means for irradiating respective electron beams to inspect a plurality of inspection target holes; current measuring means for measuring current, which is generated by irradiating the electron beams radiated from the electron beam irradiation means, through a conductive layer located under the holes, or through the conductive layer and a separate detector; and data processing means for processing data acquired through the measurement of the current measuring means; wherein a plurality of electron columns, which are used as the electron beam irradiation means, is disposed in an n×m arrangement in such a way that each electron column corresponds to a plurality of holes, and is simultaneously or sequentially operated, the current measuring means measures current values for the respective holes in response to the simultaneous or sequential operation of the electron columns, and the data processing means sequentially or simultaneously processes the data measured by the current measuring means, whereby information about whether the holes are open at both ends thereof is acquired.

Furthermore, when the holes are divided according to region, the electron columns are disposed in an n×m arrangement in such a way that each column corresponds to the holes of each region, and are simultaneously or sequentially operated according to the regions, the current measuring means measures current values for the respective regions in response to the operation of the electron columns for the respective regions, and the data processing means corresponds to the current measuring means, and simultaneously or sequentially processes pieces of data for the respective regions, which are measured by the current measuring means, whereby information about the depths, directions and structures of the holes for each region is subsequently acquired.

The hole inspection apparatus according to the present invention is constructed such that electron beam irradiation means are disposed in an n×m arrangement to correspond to the locations of a plurality of holes, which are inspection targets, and thus the time required to inspect the plurality of holes can be minimized. It is preferred that ultra small-sized electron columns, that is, microcolumns, be used as the electron beam irradiation means. The reason for this is because each of the micro-columns has a small size compared to an existing electron beam irradiation means, that is, a Cathode-Ray Tube (CRT), and operates at a low voltage, thus being extended and causing damage to a target to which an electron beam is radiated, to be reduced. In the present invention, a conventional hole inspection method may be used unchanged as the method of inspecting holes, such as via holes, contact holes or through holes, having a high diameter-to-length ratio thereof. A conventional method, such as a method of inspecting holes in a non-destructive manner by radiating an electron beam into the holes of an insulating layer located on a conductive layer, may be used as the hole inspection method. That is, the hole inspection apparatus according to the present invention can be implemented using the scheme disclosed in Korean Pat. No. 10-0388690.

In the present invention, the holes to be inspected may be holes, such as via holes, contact holes or through holes, that are formed in the insulating layer of a semiconductor element or device, such as a semiconductor chip. The holes of the insulating layer are open to the conductive layer through the insulating layer. In this case, the insulating layer and the conductive layer not only include the cases of a complete insulating layer and a complete conductive layer as a relative concept, but also include a relative concept pertaining to high doping and low doping in the case of a silicon layer. Particularly, in the conductive layer, conductivity is required to the extent that electrons irradiated by the electron beam irradiation means can be detected through the conductive layer. In contrast, the insulating layer has conductivity lower than the conductive layer. In this case, any kind of insulating layer can be used as long as the difference between a current value that is detected when electrons are incident on the conductive layer through the insulating layer and a current value that is detected when electrons directly reach the conductive layer through a through-hole is large enough to be obvious.

In the present invention, the electrons irradiated by the electron beam irradiation means are incident on the conductive layer through the holes formed in the insulating layer, the flow of the incident electrons through the conductive layer is detected, and thus information about the holes formed in the insulating layer is acquired. The method of acquiring the information about the holes formed in the insulating layer by detecting the flow of the electrons through the conductive layer may be classified as one of two types: 1) a method in which, when electrons, in the form of an electron beam irradiated by an electron column, reach the conductive layer through the holes formed in the insulating layer, information about through-holes is acquired based on variation in the amount of electrons detected through the conductive layer, that is, variation in a current value, and 2) another method in which information is acquired by converting the variation in the current value, which is acquired through the conductive layer, into images using the electron beam scanned by the electron column, similar to an electron microscope.

In the former method, in order to acquire information about respective holes using only the differences in the current values, the irradiated electron beam must have a constant spot size and a constant amount of electrons. That is, the electron beam irradiated onto a predetermined region must be indicated by a current value corresponding to the predetermined amount of electrons. Accordingly, attention should be paid to the generation and management of the electron beam. Accordingly, a collimated beam or a focus beam must be irradiated uniformly, and careful attention should be paid to the movement of the stage or the beam. In the inspection apparatus of the present invention, a plurality of electron beam irradiation means is disposed in an n×m arrangement in such a way that each electron beam irradiation means corresponds to a plurality of holes, so that the electron beam irradiation means can be used to inspect respective holes in response to the sequential operation of the electron beam irradiation means, or can be used to inspect respective holes in response to the simultaneous operation of the beam irradiation means or the sequential operation of the beam irradiation means for respective groups. When the electron beam irradiation means are sequentially operated, whether any of the holes are abnormal is determined based on the differences between current values which are sequentially detected. In contrast, when the electron beam irradiation means are simultaneously operated or are sequentially operated according to group, whether any of the holes are abnormal is determined based on the differences between the overall current values or based on the differences between the current values for each group.

In the latter method, a method of irradiating beams in the same manner as in an electron microscope can be used. When the insulating layer is scanned by scanning an electron beam using an electron column, electrons pass through the holes of the insulating layer and, thus, a current value is detected through the conductive layer, so that image data can be acquired using the current value. The acquired data is chiefly image data about the underside of the insulating layer.

Furthermore, image data about the openings of the holes formed in the upper portion of the insulating layer can be acquired using a separate detector. In this case, the detector detects secondary electrons, emitted from the insulating layer due to the electron beam having been scanned, or reflected electrons, and thus the image data can be acquired. In this case, a detector used for a conventional electron microscope is used as the detector, and thus the information can be acquired. Accordingly, in the latter method, both image data about the entrances of the holes of the insulating layer and image data about the outlets of the holes of the insulating layer, which are formed on the conductive layer side, can be acquired. Accordingly, whether any of the holes are abnormal can be determined based on the image data. Determining whether any of the holes are abnormal based on the image data can be realized by acquiring the size and shape of each of the holes using various methods, such as in conventional image processing. In particular, each of the microcolumns radiates a great number of electrons using low energy, so that three-dimensional image data can be acquired to some extent. The depth of such a three-dimensional image can be determined based on the amount of radiated electrons. If the amount of electrons radiated from each electron column is converted into data in advance and the electron beam is controlled, the latter method may be used together with the former method. In case of using the imaging process, the method for checking the image of the outlet of the hole at the predetermined position, and the method for comparing the image of the inlet of the hole and the image of the outlet of the hole can be used.

Both the former method and the latter method can be used to determine whether any of the holes are abnormal based on current data detected through the detector and the conductive layer.

ADVANTAGEOUS EFFECTS

The hole inspection apparatus according to the present invention can reduce the time taken to inspect holes, formed in the insulating layers, using a plurality of electron beam irradiation means.

Furthermore, in the case where the electron beam irradiation means are used as a microcolumn, a plurality of electron beams having low energy can be used, so that the danger of damage to a sample is reduced. Furthermore, in the case where the electron columns are used, image data about holes formed in the insulating layer can also be acquired using a scanning function, so that more accurate data about the holes can be acquired.

Furthermore, information about the depths, locations and shapes of respective holes, as well as information about whether holes are open at both ends thereof and images of the respective holes, can be acquired using the plurality of electron columns, so that holes formed at incorrect locations can be detected.

Furthermore, correction can be made such that holes are opened at both ends thereof using electron beams, so that it is possible to conduct repairs using a product targeted to inspection.

BRIEF DESCRIPTION OF THE DRAWINGS

The above and other objects, features and advantages of the present invention will be more clearly understood from the following detailed description taken in conjunction with the accompanying drawings, in which.

MODE FOR THE INVENTION

Figure 2:
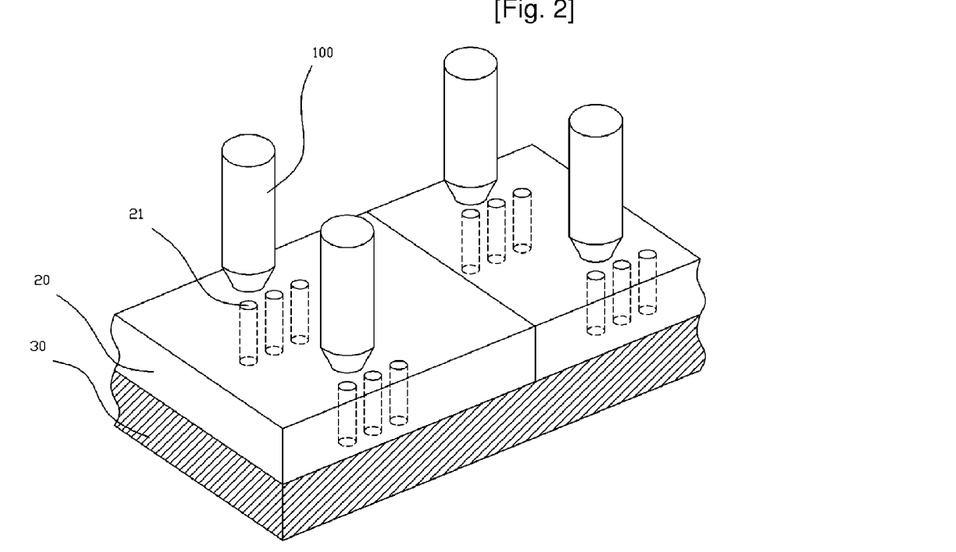
FIG. 2 is a perspective view schematically showing a hole inspection apparatus according to the present invention.

FIG. 2 is a perspective view schematically showing a hole inspection apparatus according to the present invention.

In FIG. 2, four electron columns 100 are used as electron beam irradiation means. For ease of description, each electron column 100 is described as irradiating an electron beam across three holes 21. The holes 21 are formed in an insulating layer 20. A conductive layer 30 is located under the insulating layer 20. In this case, the three holes 21 to be inspected by each electron column 100 are formed in the insulating layer 20. Although the number of holes 21 and the size and shape of each hole have been set for the sake of description of the inspection apparatus according to the present invention, the number of holes 21 and the size and shape of each hole may be variously determined.

As shown in FIG. 2, the insulating layer 20 is divided into two regions, and the conductive layer 30 located under the insulating layer 20 is formed of a single layer. Accordingly, electrons that have passed through the holes 21 of each region of the insulating layer 20 can be detected through the single conductive layer 30. If the conductive layer 30 is divided into regions and a plurality of inspection target holes exists in each region, the amounts of electrons (current values) will be detected through wiring lines for the respective regions of the conductive layer, and then data processing and inspection will be performed. A description of the case where a plurality of holes for a single conductive layer is inspected is mainly given below.

Figure 3:
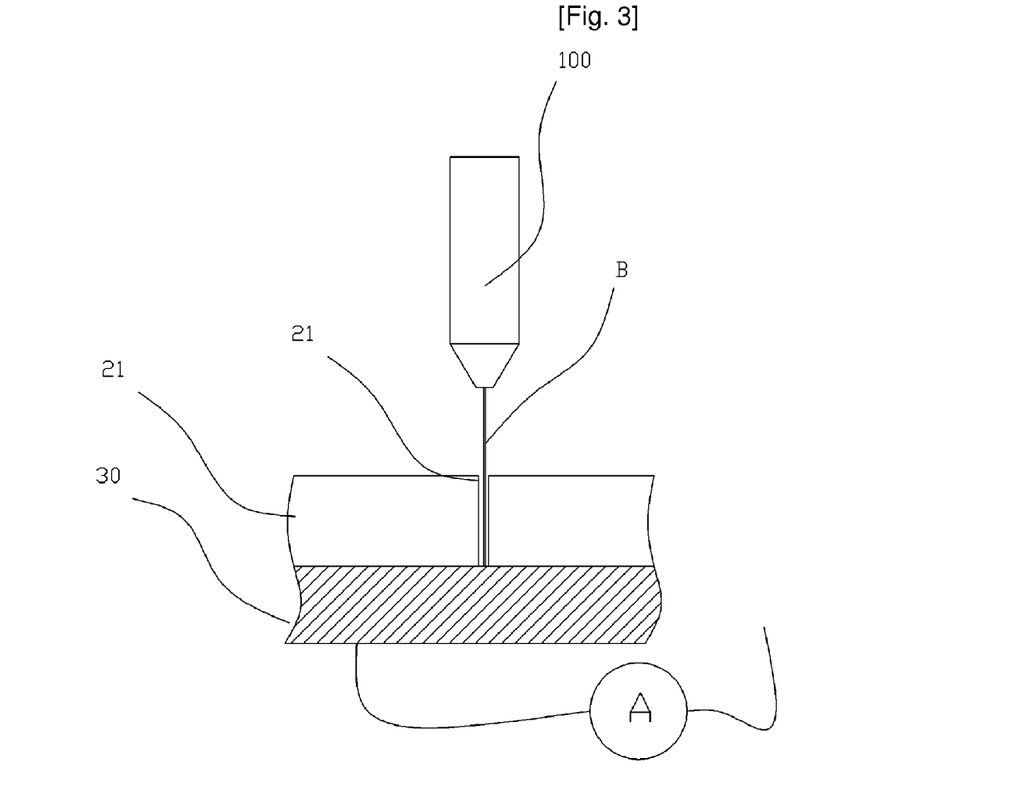
FIG. 3 is a sectional view schematically showing a single electron column being used to inspect a single hole.

FIG. 3 is a sectional view schematically showing a single electron column 100 being used to inspect a single hole 21.

An electron beam B radiated from the electron column 100 passes through the hole 21 formed in an insulating layer 20, and is irradiated to a conductive layer 30. An electron detection device A connected to the conductive layer 30 detects the amount of electrons that have reached the conductive layer 30, that is, a current value, as data about the electron beam that has reached the conductive layer 30. When a small current value is detected, the electron detection device A amplifies the current value.

Figure 4:
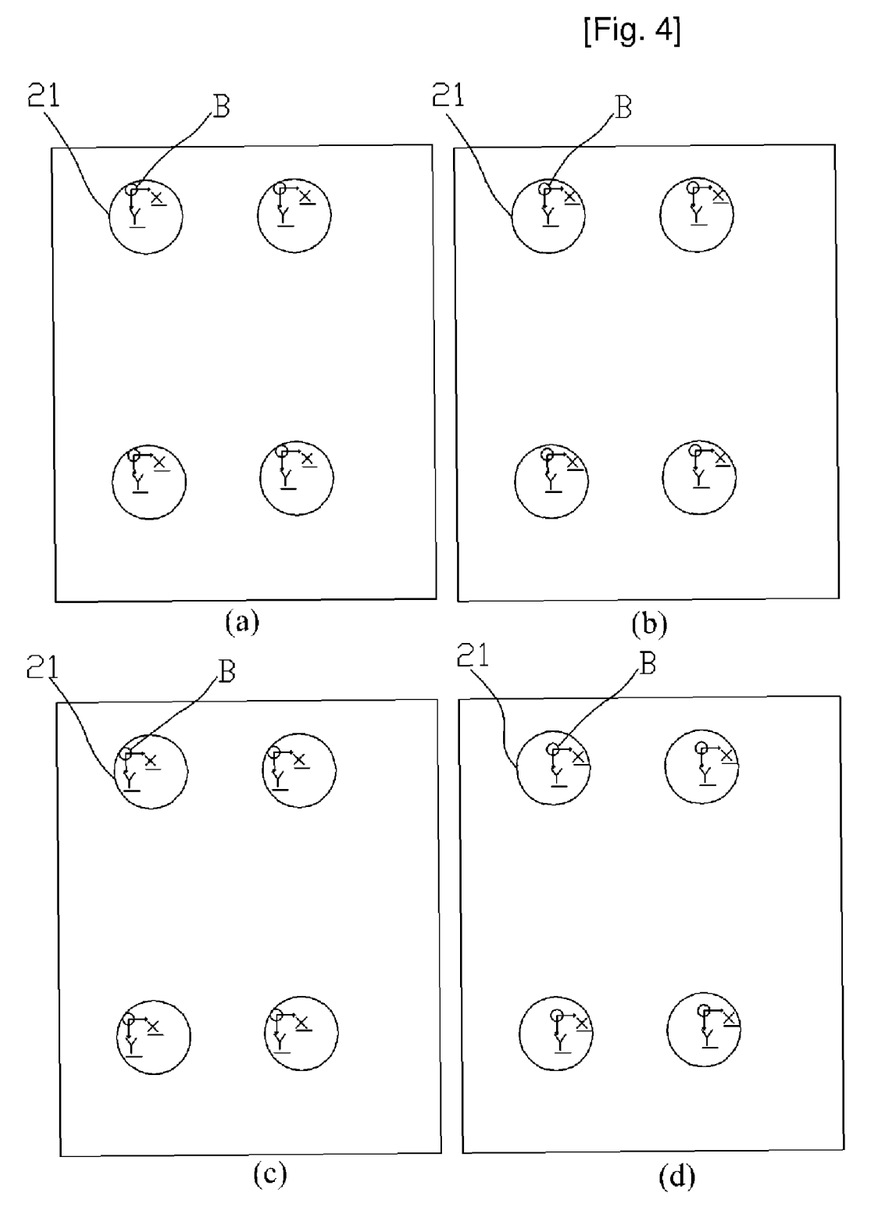
FIG. 4 is a plan view conceptually showing an example in which four electron columns are used to inspect four holes formed in an insulating layer.

FIG. 4 is a plan view conceptually showing an example in which four electron columns are used to inspect four holes 21 formed in the insulating layer. Electron beams B radiated from the respective electron columns are scanned in order from FIG. 4 (*a*) to FIG. 4 (*d*), and the holes 21 are inspected while the electron beams B from the respective electron column are scanned or moved. In FIG. 4, the size of each electron beam B is smaller than that of each hole 21. Furthermore, an electron beam radiated from each electron column is deflected by a predetermined angle due to voltage applied to a corresponding deflector (not shown), and each electron beam B is scanned by continuously varying the voltage applied to the deflector.

Figure 5:
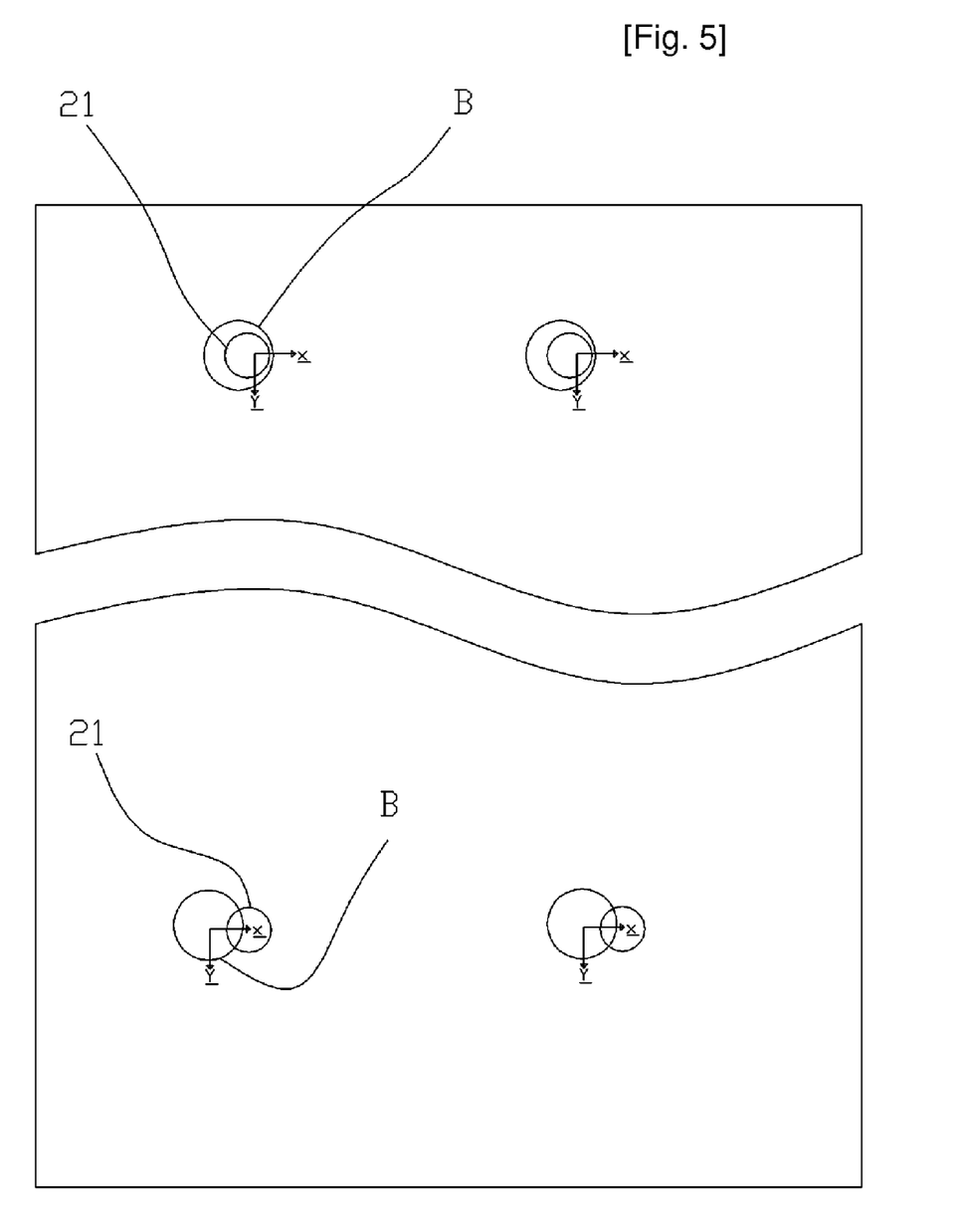
FIG. 5 is a schematic plan view conceptually showing the case where the spot size of each electron beam is larger than the size of each hole.
Figure 6:
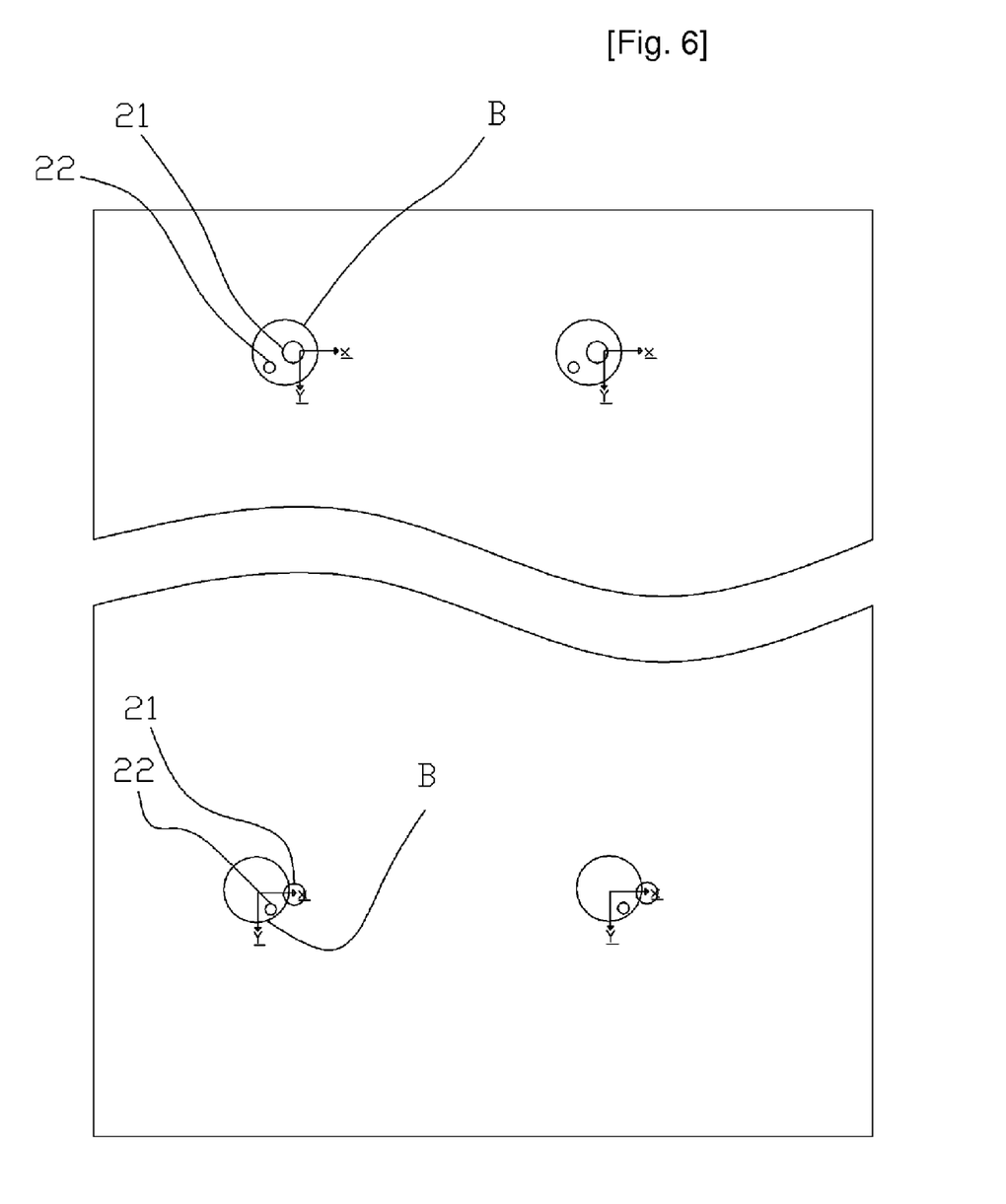
FIG. 6 is a schematic plan view conceptually showing the case where a plurality of holes is included in a single spot of each irradiated electron beam.

FIG. 5 is a schematic plan view conceptually showing the case where the spot size of each electron beam B is larger than the size of each hole 21, and FIG. 6 is a schematic plan view conceptually showing the case where a plurality of holes 21 and 22 is included in a single spot of each scanned electron beam B. FIGS. 5 and 6 show the cases where the spot size of each electron beam is larger than the size of each hole, which is an inspection target. In particular, FIG. 5 shows the case where inspection of each hole is performed, and FIG. 6 shows the case where a plurality of holes is inspected using a single beam. In this case, a microcolumn may be used as an electron beam irradiation means, without requiring scanning. Alternatively, a method of irradiating beams to desired locations using beam blankers and irradiating the beams on different holes again after moving to different locations by deflectors or a stage may be used.

A hole inspection method according to the present invention is described with reference to FIGS. 2 to 4 below.

Each of the electron beams B radiated from the respective electron columns 100 is scanned across corresponding holes 21. The scanning method is described with reference to FIG. 4.

In FIG. 4(*a*), four electron beams B are respectively radiated to the corresponding four holes 21 located in the upper left portion. The radiated electron beams B pass through the respective holes 21, are scanned to the conductive layer 30, and are detected by the electron detection device A connected to the conductive layer 30. In this case, the conductive layer 30 is formed of a single layer, so that, if the electron beams B are simultaneously scanned to the conductive layer 30, it is difficult to analyze image data about the electron beams scanned to the conductive layer 30. That is, if a large current value is simultaneously measured through the single conductive layer 30, it is difficult to acquire the images of the respective holes 21 using the current values. Accordingly, each of the electron columns 100 is provided with a device, such as a beam blanker (not shown), which enables a beam to be scanned for a predetermined time and then interrupts the beam, so that, when one electron column 100 radiates an electron beam B into a hole 21, the radiation of beams from the other electron columns 100 is interrupted by the respective beam blankers thereof. Accordingly, when another electron column 100 radiates an electron beam B after an image at a specific location has been acquired through the detection of the amount of electrons acquired through the hole 21, the radiation of beams from the other electron columns 100 is interrupted. That is, the electron columns 100 are sequentially operated, the electron detection device A detects electrons through the conductive layer 30, and thus the image data about the respective holes is acquired.

FIG. 4(*a*) shows that the electron beams B from the respective electron columns 100 are sequentially radiated to the upper left portions of respective holes 21 having the same coordinates. After the electron columns 100 have sequentially scanned the respective electron beams B on the same coordinates, the respective electron columns 100 move a predetermined distance in the X direction and sequentially scan the electron beams B again, as shown in FIG. 4(*b*). Accordingly, when the X directional scanning has been completed, the electron columns 100 move the respective electron beams B in the Y direction again, as shown in FIG. 4(*c*). In this case, scanning may be restarted after the electron beams B have been returned to the origin in the X direction, or the electron beams B may be moved in the Y direction from the final location on the X axis, as shown in FIG. 4(*c*). Thereafter, the electron columns 100 scan the respective electron beam B in the X direction, as shown in FIG. 4(*d*). The X-Y directional scanning sequence or method may be adjusted using the deflectors. In this case, it is preferred that a constant scanning sequence be used to facilitate data processing. Here, a method of radiating the electron beams B on the same coordinates of the corresponding holes 21 and, at the same time, performing the scanning has been described. However, if each electron beam B are sequentially scanned, rather than simultaneously scanned, measurement may be performed while the electron beams B individually scan predetermined corresponding regions. In this case, each of the electron beams B must scan an entire corresponding region, so that it may be difficult for the electron columns 100 to control the scanning of the respective electron beams B.

Although the method of inspecting the holes 21 while sequentially scanning electron beams to acquire image information about the holes 21 by radiating the electron beams B using the plurality of electron columns 100 has been described above, whether any of the holes 21 are abnormal can be detected using the amount of electrons acquired when all of the electron beams B simultaneously reach the conductive layer 30 through the holes 21, that is, using a current value. That is, if the amount of current that corresponds to electrons acquired when all of the electron beams are radiated to the conductive layer 30, that is, the total value, is measured by the electron detection device A, data about the locations of the respective holes and the number of holes can be acquired even if which hole has a problem cannot be determined, so that it can be determined whether any of the holes are abnormal. Furthermore, information about the sizes of the respective holes may also be entirely known while the respective electron beams are scanned.

Although the case where the electron beams are scanned has been mainly described above, inspection can be performed using collimated beams while each of electron beams or a sample is moved using a stage, or inspection can be performed while both the electron beams and the sample are moved using the stage.

FIG. 5 is a schematic plan view conceptually showing the case where the spot size of each electron beam B is larger than the size of each hole 21. The example of FIG. 5 shows the case where each hole 21 is very small, that is, it is smaller than a corresponding electron beam B. FIG. 5 shows the case where electron beams B completely cover respective upper holes 21, and electron beams B have not yet been entirely irradiated across two respective lower holes 21. When four electron columns 100 perform scanning, the electron beams B are incident on the conductive layer 31 through the respective openings of the holes 21. If the location of a hole is incorrect, the electron column 100 does not radiate an electron beam to the conductive layer 30 through the abnormal hole in the case where not all of the insulating layer is scanned, even though scanning is performed, so that image data cannot be acquired. Accordingly, the locations of abnormal holes can be checked using the image data. However, in the case where current values are detected through the conductive layer 30 merely by simultaneously radiating electron beams, the number of abnormal holes may be known, but it is difficult to acquire information about the locations of the abnormal holes.

In the example of FIG. 5 each electron beam B may have a small scanning range, in contrast to the example of FIG. 4, or scanning may not be required. In this case, it is necessary to sequentially scan the electron beams B as described above in conjunction with FIG. 4 in order to acquire the image data or to detect problematic holes. In order to merely determine whether the holes 21 are abnormal, the electron beams B may be radiated while the electron columns 100 are simultaneously moved or perform scanning. The method of acquiring the images of the respective hole 21 or the method of determining whether the holes are abnormal are achieved in the same manner as the description of FIG. 4, or in a manner similar thereto.

FIG. 6 shows an example that is used for the case where the spot size of each of the two electron beams, as shown in FIG. 5, is larger than the inspection target hole, or for the case where a plurality of inspection target holes is included in the spot size of a single electron beam. For ease of description, FIG. 6 shows the case where two holes 21 and 22 are included in the spot B of each electron beam. Upper electron beams B radiated from the two electron columns are irradiated such that the two holes 21 and 22 are entirely included in the spot of each of the electron beams B. Each of two lower electron beams B includes only one hole 22 and does not completely include the other hole 21. Accordingly, all of the holes can be included through the scanning of electron beams as described above. In contrast, in the example of FIG. 6, the spot size of each of the electron beams can be intentionally increased by adjusting the focus. As one method, out focusing, that is, a method of adjusting the focal point before the focal point reaches a sample and increasing the spot size of an electron beam before the electron beam reaches the opening of a hole may be used. As another method, a method of increasing the size of an electron beam itself and scanning the electron beam in the form of a collimated beam may be used. In this case, the size of the beam may be adjusted using a focus lens or some other lenses. The example of FIG. 6 is advantageous in that, when inspection of a number of holes is performed, only whether the holes are opened at both ends thereof can be inspected in a short time. That is, if all of the holes are exactly passed through, the amount of electrons detected by the conductive layer 30 will be constant. Furthermore, in the example of FIG. 6, the inspection can be continuously performed using a method of irradiating the electron beams to desired coordinates or locations and moving the electron beams to different locations using beam blankers, rather than by scanning. The movement to the irradiating locations of the respective electron beams may be realized by moving the beams with the beam blanker and the deflectors, moving the sample using a stage or the like, moving small-sized electron beam irradiation means, such as microcolumns, using a stage or the like, or moving both the sample and the electron beam irradiation means. In particular, the use of the example of FIG. 6 is convenient in the case where small holes are formed adjacent to each other. In separate large holes, the example of FIG. 6 may be used, in the same manner as FIG. 5.

Furthermore, in the case of FIG. 4 or 5, inspection may be performed using a method of performing irradiating one time without requiring movement using beam blankers, rather than performing scanning across holes or around holes, and performing irradiating again at predetermined locations corresponding to the locations of inspection target holes.

The method of determining whether holes are abnormal based on the images of respective holes using a plurality of electron columns, and the method of merely determining whether all of the holes are abnormal using current data acquired through the conductive layer have been described above.

In the case where the plurality of electron columns is used, the holes and the electron columns correspond one-to-one and, thus, the inspection can be rapidly performed. In contrast, in the case where the distance between the holes is small, a single electron column must be used to inspect a plurality of holes. In order to inspect the plurality of holes using the single electron column, as described above, it is required that the electron column be enabled to scan a wide region, or it is required that the electron column or a sample be moved. When it is desired to determine whether holes are abnormal based on current values detected through the conductive layer in the case where the electron columns perform scanning, it may be necessary to convert, in advance, the current values, corresponding to the electron beams radiated from the electron columns according to scanning angles, to data. That is, the electron columns can be made to deflect the respective electron beams by a predetermined value by controlling the corresponding deflectors. If deflection is performed at predetermined intervals when an electron beam is deflected, the amount of electrons radiated at the predetermined intervals can be detected in advance and converted to data. That is, prior to the inspection of the holes, the amount of electrons can be converted to data in advance using a method of measuring, in advance, the amount of electrons radiated from the electron columns at a predetermined distance according to angle. Whether holes are abnormal can be determined based on this data.

Furthermore, as one of preferred inspection methods according to the present invention, inspection is performed using a method of enabling a plurality of electron beam irradiation means for a plurality of holes to simultaneously operate in the same region in a short time, enabling the electron detection means to detect all of the abnormal holes through wiring lines for the same conductive layer 30, and determining whether holes are abnormal using the data processing means. If it is determined that an abnormal hole exists, that is, if the detected number of electrons is smaller than the predetermined number of electrons, the respective holes are sequentially inspected as in FIG. 4 or 5 and, thus, which hole is abnormal can be detected. In the method of simultaneously scanning a plurality of holes, it is preferred that the plurality of holes be inspected using a beam having a large spot size as quickly as possible, as shown in FIG. 6.

Furthermore, in the case where it is determined that the hole is not open at both ends thereof using an electron beam, or where there is a problem in the shape of the through-hole (it is greatly bent or the diameter of the hole is small), the hole may be open at both ends thereof or may be modified to have a desired shape using the electron beam. This means that the conditions of an electron beam, that is, the energy, beam spot, beam current, acceleration voltage and the like thereof, is changed, such a beam is continuously radiated onto the portion that is not open at both ends of the hole, or onto a protrusion of the hole, and thus only the portions onto which the electron beam is radiated are removed from the insulating layer. Although variations may be made according to the material of the insulating layer, repairs can be achieved by using a method, such as a repair function using an electron beam. That is, repairs can be achieved by scanning the electron beam into the hole and etching a sample. Here, the portions can be directly etched when the electron beam is changed to an ion beam. Furthermore, a method of removing the portion that is not open at both ends of the hole or the protrusion by injecting etching assist gases, selected according to the material, and spraying the gases onto an area to be scanned may be used. In this case, although a method like FIG. 5 may be used, it is preferred that the method of radiating an electron beam, having a spot size smaller than the diameter of a hole, into a hole, like that of FIG. 4, be used.

Furthermore, in the present invention an electron beam irradiation means could be tilted by tilting means in the case of the electron beam irradiation means using as a microcolumn, since the microcolumn may have small size (below 10 cm). a tilting stage or a small arm robot which is used as a tilting means could be coupled with the microcolumn in a vacuum chamber. By the tilting the microcolumn, it is possible to widen the scanning range of the electron beam. Also it may be possible to get the image data of inside shape of holes by tiling the microcolumn, instead of tiling the sample.

INDUSTRIAL APPLICABILITY

The apparatus and method for inspecting holes according to the present invention can be used as an apparatus and method for inspecting holes in a process of manufacturing a semiconductor device, such as a semiconductor wafer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A hole inspection apparatus, comprising:
   electron beam irradiation means for irradiating respective electron beams to inspect a plurality of inspection target holes;
   current measuring means for measuring current, which is generated by irradiating the electron beams radiated from the electron beam irradiation means, through a conductive layer located under the holes, or through the conductive layer and a separate detector; and
   data processing means for processing data acquired through the measurement of the current measuring means;
   wherein a plurality of electron columns, which are used as the electron beam irradiation means, are disposed in an n×m arrangement in such a way that each electron column corresponds to a plurality of holes, and is sequentially operated,
   the current measuring means measures current values for the respective holes in response to the sequential operation of the electron columns, and
   the data processing means sequentially processes the data measured by the current measuring means,
   whereby information about whether the holes are open at both ends thereof is acquired, wherein the data processing means inspects the depths, directions and structures of the respective holes by converting data, acquired through the conductive layer and the detector, into images.

2. The hole inspection apparatus according to claim 1, wherein, when the holes are divided according to region, the electron columns are disposed in an n×m arrangement in such a way that each column corresponds to holes of each region, and are simultaneously or sequentially operated according to the regions,
the current measuring means measures current values for the respective regions in response to operation of the electron columns for the respective regions, and
the data processing means corresponds to the current measuring means, and simultaneously or sequentially processes pieces of data for the respective regions, which are measured by the current measuring means,
whereby information of the holes for each region is acquired.

3. The hole inspection apparatus according to claim 2, wherein the holes can be corrected using the electron beams.

4. The hole inspection apparatus according to claim 1, wherein the electron beams are simultaneously irradiated to a plurality of holes, and thus the plurality of holes is simultaneously inspected.

5. The hole inspection apparatus according to claim 1, wherein the electron beam irradiation means further comprise beam blankers.

6. The hole inspection apparatus according to claim 1, wherein the holes can be repaired or corrected using the electron beams when the holes are not open at both ends thereof.

7. The hole inspection apparatus according to claim 1, wherein the electron beam irradiation means further comprise tilting means.

8. A hole inspection method, comprising the steps of:
disposing a plurality of electron columns in an n×m arrangement in such a way that each electron column corresponds to a plurality of holes, and irradiating sequentially a plurality of electron beams;
measuring current, which is generated by the electron beams irradiated by the electron columns, using a conductive layer formed under the holes, or using the conductive layer and a detector; and
processing the measured current data;
whereby information about pass-through of each hole is acquired,
wherein, at the step of processing the data, pieces of data, which are acquired through the conductive layer and the detector, are converted to images, and thus depths, directions and structures of the respective holes are inspected.

9. The hole inspection method according to claim 8, wherein, when the holes are divided according to region, the step of irradiating the electron beams is performed such that the electron columns are disposed in an n×m arrangement in such a way that each electron column corresponds to holes of each region, and simultaneously or sequentially scans electron beams according to region;
the step of measuring the current is performed such that current values for the respective region are measured in response to operation of the electron columns for the respective regions, and
the step of processing the data is performed such that pieces of current data for the respective regions, which are measured at the step of measuring the current, are simultaneously or sequentially processed,
whereby information about whether holes in each region are open at both ends thereof is simultaneously or subsequently acquired.

10. The hole inspection method according to claim 9, wherein the electron beams are simultaneously irradiated to a plurality of holes, and thus the plurality of holes are simultaneously inspected.

11. The hole inspection method according to claims 9, wherein, when a fault occurs after the plurality of holes are simultaneously inspected through the irradiating of the electron beams, the electron beams are subsequently radiated to respective holes again, and thus the holes are respectively inspected.

12. The hole inspection method according to claim 9, wherein, at the step of irradiating the electron beams, the electron beams are irradiated only at locations of predetermined holes, without being scanned.

13. The hole inspection method according to claim 8, wherein the electron beams are simultaneously irradiated to a plurality of holes, and thus the plurality of holes is simultaneously inspected.

14. The hole inspection method according to claim 8, wherein, when a fault occurs after the plurality of holes are simultaneously inspected through the irradiating of the electron beams, the electron beams are subsequently radiated to respective holes again, and thus the holes are respectively inspected.

15. The hole inspection method according to claim 8, wherein, at the step of irradiating the electron beams, the electron beams are irradiated only at locations of predetermined holes, without being scanned.

16. The hole inspection method according to claim 8, further comprising, when an abnormality occurs in the step of processing the data, a step of repairing or correcting a corresponding hole through radiation of an electron beam to the corresponding hole.

17. The hole inspection method according to claim 8, wherein the step of irradiating the electron beams is performed by tilted.

* * * * *